(12) United States Patent
Amemiya et al.

(10) Patent No.: US 7,541,820 B2
(45) Date of Patent: Jun. 2, 2009

(54) PROBE CARD

(75) Inventors: Takashi Amemiya, Nirasaki (JP); Hisatomi Hosaka, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 11/883,885

(22) PCT Filed: Jun. 27, 2006

(86) PCT No.: PCT/JP2006/312790

§ 371 (c)(1),
(2), (4) Date: Aug. 8, 2007

(87) PCT Pub. No.: WO2007/007544

PCT Pub. Date: Jan. 18, 2007

(65) Prior Publication Data

US 2008/0150558 A1      Jun. 26, 2008

(30) Foreign Application Priority Data

Jul. 12, 2005   (JP) .............................. 2005-203285

(51) Int. Cl.
*G01R 31/02* (2006.01)
(52) U.S. Cl. .................................................. 324/754
(58) Field of Classification Search ......... 324/754–762; 439/482
See application file for complete search history.

(56) References Cited

U.S. PATENT DOCUMENTS

| | | | | |
|---|---|---|---|---|
| 5,828,226 A * | 10/1998 | Higgins et al. | ............... | 324/762 |
| 6,102,710 A * | 8/2000 | Beilin et al. | ................... | 439/67 |
| 6,677,771 B2 * | 1/2004 | Zhou et al. | ................... | 324/758 |
| 6,841,882 B2 * | 1/2005 | Chien | ......................... | 257/777 |
| 6,969,622 B1 * | 11/2005 | Kokubo et al. | ................. | 438/14 |
| 7,372,286 B2 * | 5/2008 | Lee et al. | ..................... | 324/757 |
| 2002/0132501 A1 * | 9/2002 | Eldridge et al. | ............... | 439/66 |

FOREIGN PATENT DOCUMENTS

| | | |
|---|---|---|
| JP | 10-506197 | 6/1998 |
| JP | 2002-531836 | 9/2002 |
| JP | 2003-7782 | 1/2003 |
| JP | 2004-077153 | 3/2004 |
| WO | WO 96/15458 | 5/1996 |
| WO | WO 00/33096 | 6/2000 |

* cited by examiner

*Primary Examiner*—Ha Tran T Nguyen
*Assistant Examiner*—Arleen M Vazquez
(74) *Attorney, Agent, or Firm*—Finnegan, Henderson, Farabow, Garrett & Dunner, LLP

(57) ABSTRACT

A probe card includes a contactor supporting probes, and a printed wiring board electrically connected to the contactor. An elastic sheet is interposed between the contactor and the printed wiring board. The elastic sheet is formed so that elasticity in a central side is smaller than that in an outer peripheral side of the contactor. An elastic reaction force which acts on the contactor from the elastic sheet when the elastic sheet is compressed becomes weaker at the central part side as compared with the outer peripheral side of the contactor. Thereby, the bending amount of a central part of the contactor which is away from a fixed end and bends the most is reduced, and horizontality of the contactor is maintained.

2 Claims, 8 Drawing Sheets

PROBE CARD

TECHNICAL FIELD

The present invention relates to a probe card for inspecting electric characteristics of an inspection object such as a wafer.

BACKGROUND ART

Inspection of the electric characteristics of electronic circuits such as an IC and an LSI formed on, for example, semiconductor wafers is conducted by using a prober having a probe card. A probe card generally has a contactor which supports a number of probes, and a circuit board which is electrically connected to the contactor. The contactor is disposed so that an undersurface on which the probes are supported is opposed to a wafer, and the circuit board is disposed to be overlaid on a top surface side of the contactor so that electrical connection with the contactor is maintained. Inspection of the electric characteristics of a wafer is conducted by bringing a plurality of probes into contact with each of the electrodes of an electronic circuit on the wafer and transmitting an electrical signal for inspection to the electrodes on the wafer through the circuit board, the contactor and the probes.

Inspection of the electric characteristics is conducted in the temperature region of a wide range of, for example, −20° C. to 150° C. Therefore, the circuit board sometimes expands and contracts due to, for example, a thermal effect at the time of inspection, and flatness and horizontality of the circuit board are sometimes reduced. In this case, electrical contact of the circuit board and the contactor becomes unstable in the contactor surface, and inspection is not properly conducted. In order to solve such a problem, it is proposed at present to dispose an interposer, which is constituted of a board with interconnection elements in spring forms mounted on a top surface and an undersurface, between a contactor and a circuit board, for example (see Patent Document 1).

[Patent Document 1] Translated National Publication of Patent Application No. Hei 10-506197

DISCLOSURE OF THE INVENTION

Problems to be Solved by the Invention

However, when the interposer constituted of a plurality of members as described above is mounted between the circuit board and the contactor, the structure of the entire probe card is complicated. Since the above described interposer takes a width in the vertical direction, for example, the contactor and the circuit board separate from each other, and the entire probe card becomes large in size.

Thus, it can be proposed to mount a sheet-shaped interposer having electric conductivity and elasticity between a contactor and a circuit board to maintain electrical contact of the circuit board and the contactor by this interposer.

However, in this case, the interposer has uniform elasticity in the contactor surface, and therefore, the load which acts on the contactor from the interposer due to the elastic reaction force of the interposer becomes a uniformly distributed load in the contactor surface. Therefore, at the time of contact of the probes and the wafer, the uniformly distributed load is exerted on the contactor from the interposer, and a central part of the contactor which is away from fixed ends of the outer peripheral part of the contactor sometimes bends significantly. In this case, flatness of the contactor surface is lost, and the heights of a plurality of probes supported on the contactor vary. As a result, contact of each of the probes and the wafer at the time of inspection becomes unstable, and inspection of the electric characteristics of the wafer is not conducted properly.

The present invention is made in view of the above respect, and has an object to stabilize contact of an inspection object such as a wafer and probes and conduct inspection of electric characteristics properly.

Means for Solving the Problems

In order to attain the above described object, the present invention is a probe card for inspecting electric characteristics of an inspection object, and has a contactor supporting probes on one surface at a side of the inspection object, a circuit board which is opposed to the other surface of the aforesaid contactor and electrically connected to the aforesaid contactor, and a connector which is interposed between the other surface of the aforesaid contactor and the aforesaid circuit board, electrically connects the aforesaid contactor and the aforesaid circuit board, and has elasticity, and the aforesaid connector is formed so that elasticity of a part near a central side becomes smaller than that of an outer peripheral side of the aforesaid contactor.

According to the present invention, a load which acts on the contactor from the connector by elasticity of the connector becomes smaller in the central side than in the outer peripheral side of the contactor. Thereby, the bending amount of the central part of the contactor which is easily bent by the load is reduced. As a result, flatness of the entire contactor is enhanced, variation in heights of the probes on the contactor is reduced, and contact of the probes and inspection object is stabilized.

The aforesaid connector may be formed into a sheet shape which is in contact with the other surface of the aforesaid contactor, and the aforesaid connector may be formed so that elasticity becomes smaller stepwise as it is closer to the central side from the outer peripheral side of the aforesaid contactor.

In the aforesaid connector, regions differing in elasticity may be formed in a shape of concentric circles with a center of the aforesaid contactor as a center of the circles in a plane view.

The aforesaid connector may be a plurality of connection pins disposed in the other surface of the aforesaid contactor, and the connection pins smaller in elasticity than the connection pins in the outer peripheral side may be disposed in the central side of the other surface of the aforesaid contactor.

EFFECT OF THE INVENTION

According to the present invention, contact of the probes and the inspection object is performed stably, and therefore, inspection with high accuracy and high reliability can be conducted.

EXPLANATION OF CODES

1 PROBER
2 PROBE CARD
10 PROBE
11 CONTACTOR
12 ELASTIC SHEET
13 PRINTED WIRING BOARD
W WAFER

BEST MODE FOR CARRYING OUT THE INVENTION

Figure 1:
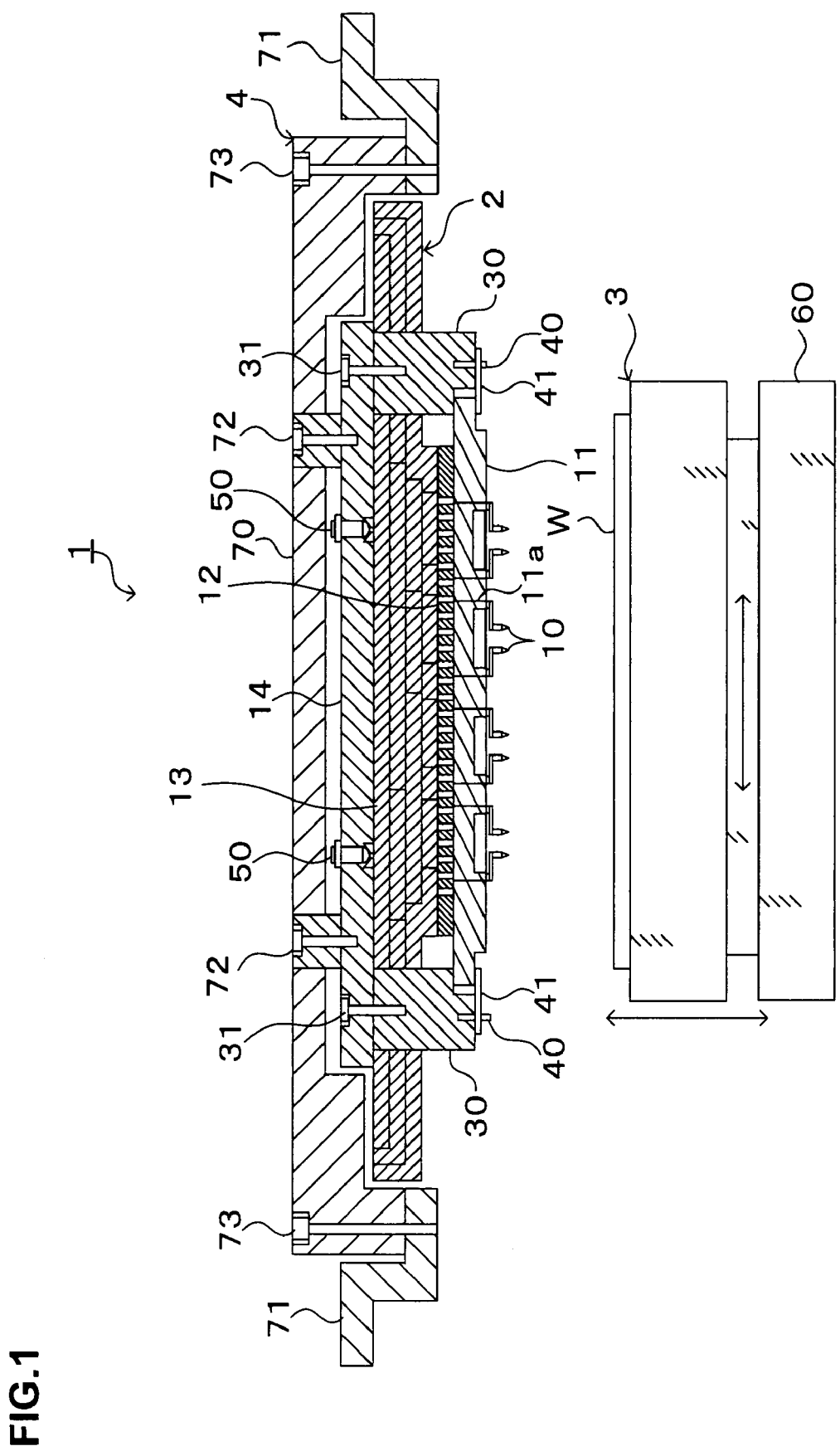
FIG. 1 is a longitudinal sectional view showing the outline of the construction of a prober.

Preferred embodiments of the present invention will now be described. FIG. 1 is a longitudinal sectional view showing the outline of a construction of an inside of a prober 1 mounted with a probe card according to this embodiment.

The prober 1 includes, for example, a probe card 2, a mounting table 3 for mounting a wafer W as an inspection object, and a card holder 4 which holds the probe card 2.

The probe card 2 is entirely formed into a substantially disk shape, for example. The probe card 2 includes a contactor 11 which supports a plurality of probes 10, a printed wiring board 13 as a circuit board which is electrically connected to the contactor 11 by an elastic sheet 12 as a contact element, and a reinforcing member 14 which reinforces the printed wiring board 13.

The contactor 11 is formed into a substantially square board shape, for example, and is disposed at a side of an under surface of the probe card 2 to be opposed to the mounting table 3. A plurality of probes 10 are joined to and supported on an undersurface of the contactor 11. Connecting wires 11a for energizing the respective probes 10 and the elastic sheet 12 on the side of the top surface are formed inside the contactor 11.

The printed wiring board 13 is formed into a substantially disk shape, for example, and is disposed at the side above the contactor 11 to be parallel with the contactor 11. An electronic circuit for transmitting an electrical signal between a test head not shown and the contactor 11 is formed inside the printed wiring board 13.

Figure 2:
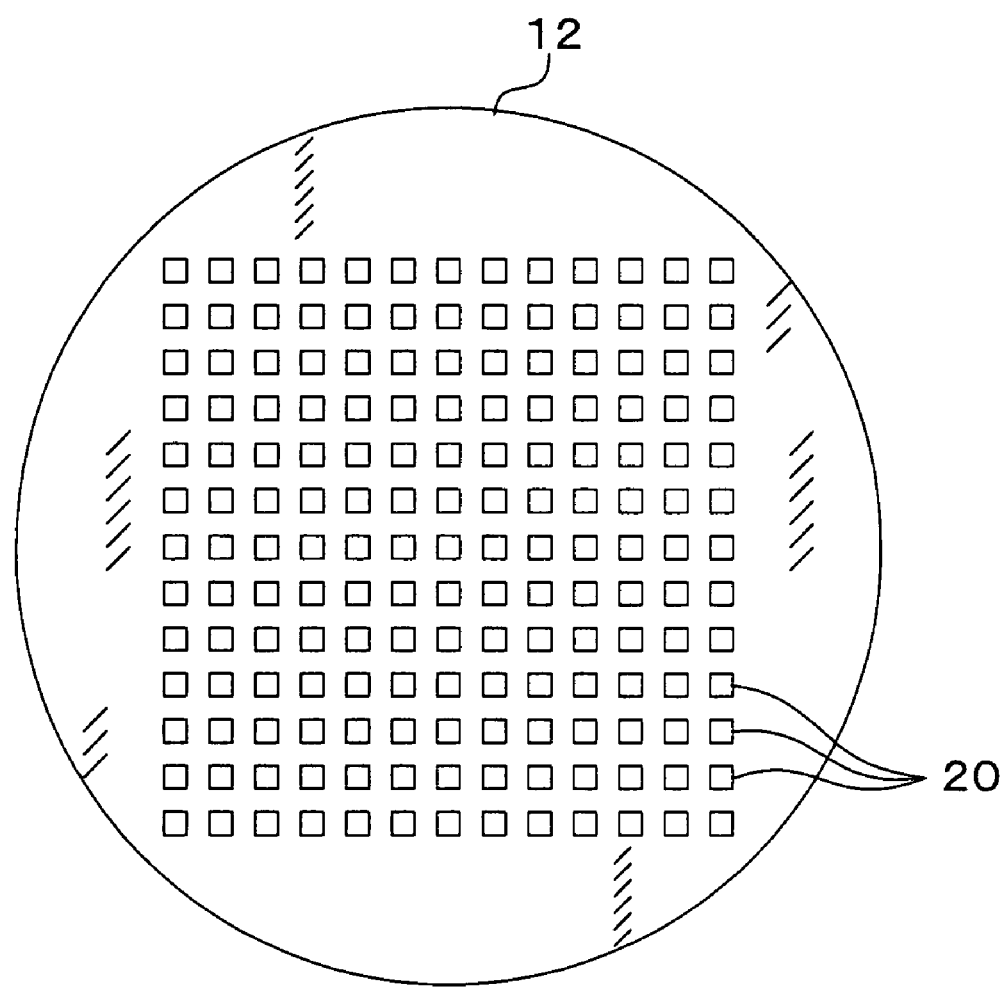
FIG. 2 is a plane view of an elastic sheet.

The elastic sheet 12 is interposed between the printed wiring board 13 and the contactor 11. The elastic sheet 12 is formed into a circular shape as shown in FIG. 2, for example, and is disposed to cover the top surface of the contactor 11. The elastic sheet 12 is formed mainly of, for example, rubber having insulation properties and elasticity. The elastic sheet 12 is formed to have a thickness of about 100 µm, for example.

Figure 3:
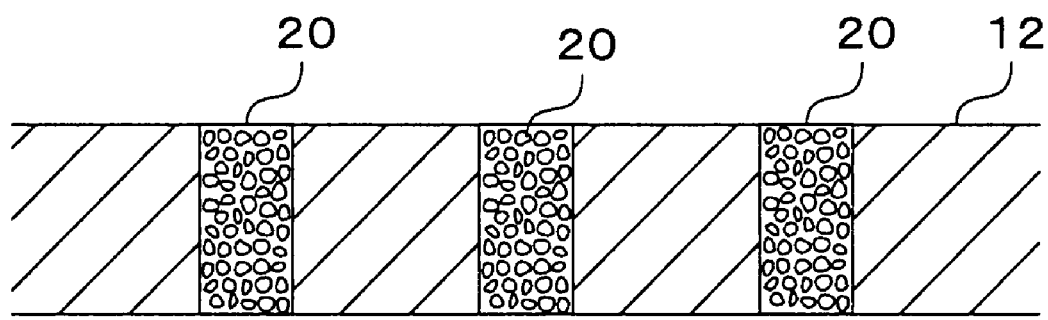
FIG. 3 is a longitudinal sectional view of the elastic sheet.

A plurality of conductive parts 20 are densely formed within the surface of the elastic sheet 12. The conductive parts 20 are formed to penetrate in the thickness direction as shown in FIG. 3. The conductive part 20 is formed by charging conductive particles into the rubber material of the elastic sheet 12. By the conductive parts 20, the contactor 11 and the printed wiring board 13 can be electrically connected.

Figure 4:
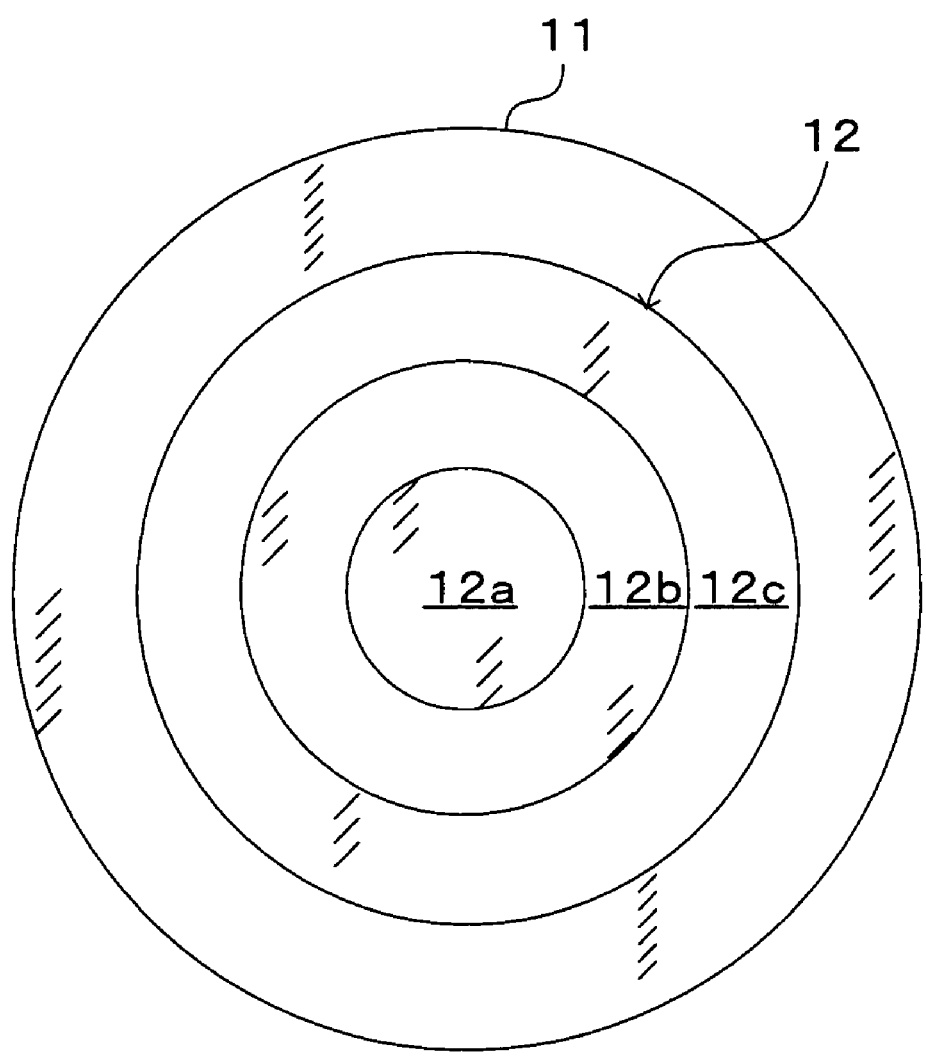
FIG. 4 is a plane view of the elastic sheet and a contactor.

The elastic sheet 12 is constituted of a plurality of, for example, three sheets 12a, 12b and 12c which are separated into the shape of concentric circles with the center of the contactor 11 as the center of the circles in the plane view as shown in FIG. 4. The first sheet 12a is formed into a circular shape located in the central part of the elastic sheet 12, and the second sheet 12b is formed into a ring shape located in the outside of the first sheet 12a. The third sheet 12c is formed into a ring shape which is located further outside the second sheet 12b and at an outer peripheral part of the elastic sheet 12. The elastic sheet 12 is formed by composing these sheets 12a to 12c.

The elastic sheet 12 is formed so that elasticity of the central side becomes stepwise smaller than that of the outer peripheral side. Namely, the elasticity of each of the sheets 12a to 12c is set so that the elasticity of the second sheet 12b becomes smaller than that of the third sheet 12c, and the elasticity of the first sheet 12a becomes smaller than that of the second sheet 12b. The elasticity of each of the sheets 12a to 12c is set by forming the respective sheets from the materials differing in elastic coefficient, for example. Thereby, when the elastic sheet 12 is compressed between the contactor 11 and the printed wiring board 13, the elastic reaction force to the contactor 11 becomes weaker in the central side than the outer peripheral side of the elastic sheet 12.

The reinforcing member 14 shown in FIG. 1 has a substantially disk shape, for example, and is disposed on a top surface side of the printed wiring board 13 to be parallel with the printed wiring board 13.

A Connector 30 for connecting the contactor 11, the printed wiring board 13 and the reinforcing member 14 and integrating them is fixed to an undersurface of an outer peripheral part of the reinforcing member 14, for example. The connector 30 is fixed by a bolt 31 which penetrates through the reinforcing member 14 in the thickness direction from the top surface side of the reinforcing member 14, for example.

The connector 30 is formed in a substantially square pole shape longer in the vertical direction, for example. A plurality of connectors 30 are provided at a plurality of spots of the outer peripheral part of the contactor 11, for example. The respective connectors 30 are disposed equidistantly on the same circumference with the center of the contactor 11 as the center of the circle in the plane view.

The connector 30 penetrates through the printed wiring board 13 in the thickness direction, for example, and its lower end part reaches the position outward of the outer peripheral part of the contactor 11. A plate spring 41 is fixed to a lower end surface of the contactor 30 by a bolt 40. The contactor 11 is pressed to the side of the printed wiring board 13 while the outer peripheral part of the contactor 11 is held from the underside by the plate spring 41, and thereby, electrical contact of the contactor 11 and the printed wiring board 13 can be maintained. By fixing by the plate spring 41, the outer peripheral part of the contactor 11 becomes the fixed end.

The reinforcing member 14 is provided with a parallelism adjusting screw 50 which penetrates in the thickness direction from the top surface side, for example, and contacts the top surface of the printed wiring board 13. A plurality of parallelism adjusting screws 50 are provided at a plurality of spots in the surface of the reinforcing member 14. By rotating each of the parallelism adjusting screws 50 and adjusting the distance by which each of the parallelism adjusting screws 50 presses the top surface of the printed wiring board 13, horizontality of the printed wiring board 13 can be adjusted.

The mounting table 3 is constructed to be movable in the lateral direction and in the vertical direction by a drive device 60, for example, and can three-dimensionally move the wafer W which is mounted thereon, and can bring a desired portion of the wafer W into contact with the probes 10.

The card holder 4 includes, for example, a top plate 70 which covers a top surface of the probe card 2, and a holder 71 which supports an outer peripheral part of the top plate 70 and is fitted to a main body of the prober 1.

The top plate 70 is formed into a substantially disk shape, for example. A recessed part is formed at an undersurface side of the top plate 70, for example, and an upper side of the probe card 2 is housed in the recessed part. The top plate 70 is connected to the reinforcing member 14 by a plurality of bolts 72.

The top plate 70 is fixed to the holder 71 by a bolt 73 which penetrates through the top plate 70 in the thickness direction from the top surface of the outer peripheral part of the top plate 70. The holder 71 is fixed to the main body not shown of the prober 1.

When the electric characteristics of the wafer W are inspected in the prober 1 constructed as above, the wafer W is mounted on the mounting table 3 first. Next, for example, the mounting table 3 moves, the wafer W is caused to be moved close to the probe card 2, and each of the electrodes of the wafer W is pressed against each of the probes 10 to be in contact with it. Then, an electrical signal for inspection is transmitted to the wafer W through the printed wiring board 13, the elastic sheet 12, the contactor 11 and the probes 10, and the electric characteristics of the electronic circuit of the wafer W are inspected.

Figure 5:
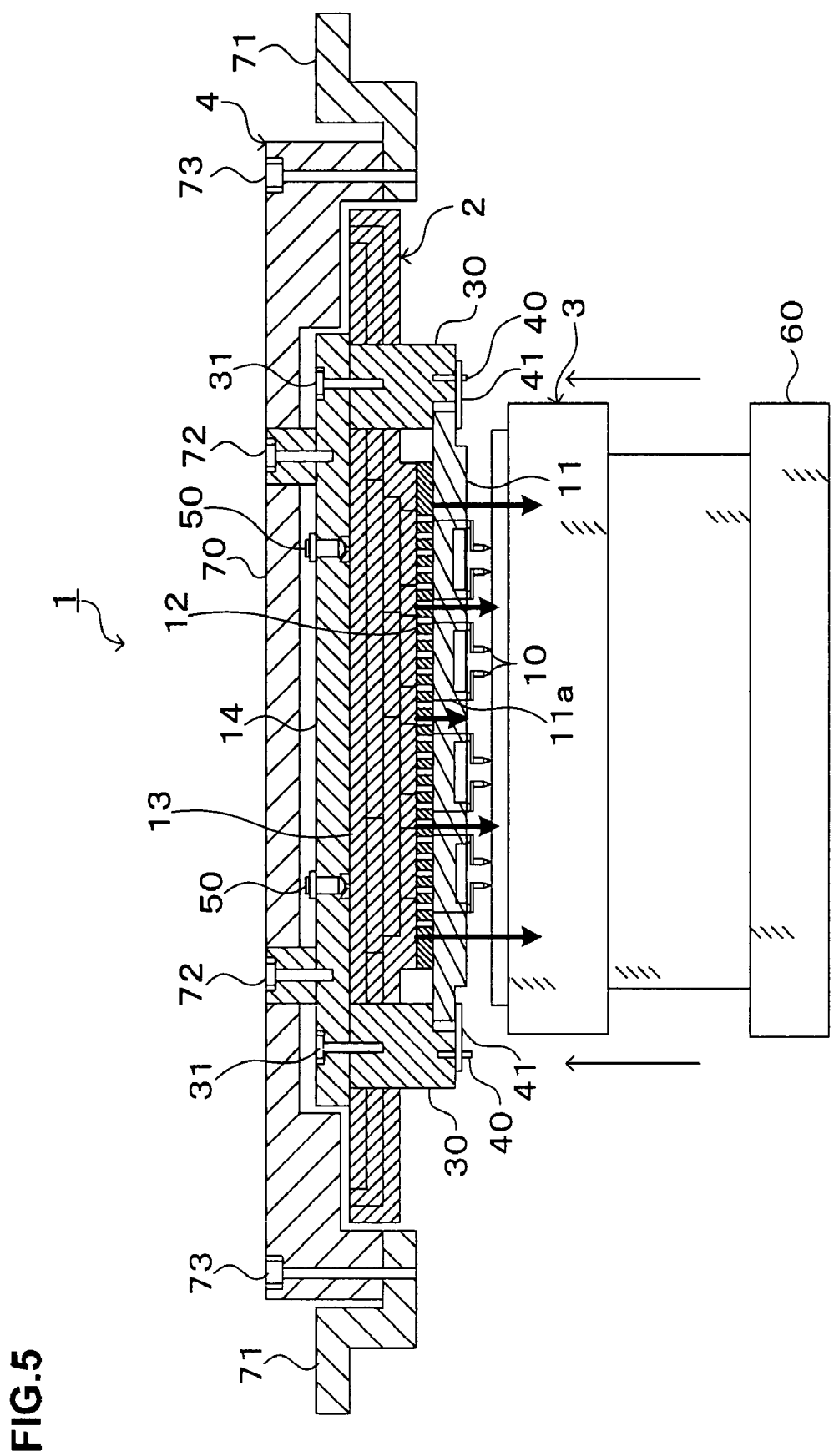
FIG. 5 is a longitudinal sectional view of the prober showing a load exerted on the contactor when a wafer is brought into contact with probes.

At the time of contact of the probes 10 and the wafer W, the load in the upward direction is exerted on the probe card 2, and the elastic sheet 12 is compressed by the load. About the elastic reaction force of the elastic sheet 12 at this time, the elastic reaction force of the first sheet 12a is the weakest, then, the elastic reaction force of the second sheet 12b is the second weakest, and the elastic reaction force of the third sheet 12c is the strongest, due to difference in elasticity. Namely, as shown in FIG. 5, the elastic reaction force is weak in the central side of the elastic sheet 12, and is strong in the outer peripheral side. Thereby, the load which acts on the central side of the contactor 11 becomes smaller as compared with that in the outer peripheral side. As a result, in the contactor 11 of which outer peripheral part is fixed by the plate springs 41, the bending amount in the vicinity of the central part which bends the most is reduced.

According to the above embodiment, the distribution of elasticity in which elasticity is smaller in the central side as compared with the outer peripheral side is formed in the surface of the elastic sheet 12, and therefore, the distribution of the load which acts on the contactor 11 from the elastic sheet 12 becomes small in the central side and large in the outer peripheral side. Since the load which acts on the central side of the contactor 11 which easily bends is reduced thereby, the bending amount in the vicinity of the center of the contactor 11 decreases, and horizontality in the surface of the contactor 11 can be maintained. As a result, variation in the heights of a plurality of probes 10 which are supported by the contactor 11 is suppressed, and contact of each of the probes 10 and the wafer W can be performed stably.

In the above embodiment, the elastic sheet 12 is divided into the three sheets differing in elasticity, but it may be divided into a plurality of sheets other than three. In the above described embodiment, the elastic sheet 12 is constituted of the three sheets 12a to 12c, and their elasticity is changed stepwise, but the elastic sheet 12 may be constituted so that the elasticity in the surface of the elastic sheet 12 becomes continuously smaller from the outer peripheral side toward the central side. In this case, the continuous distribution of the elasticity in the elastic sheet 12 may be realized by gradually decreasing the mixture ratio of the material having elasticity toward the central side from the outer peripheral side, in the material component of the elastic sheet 12, for example.

In place of the elastic sheet 12 described in the above embodiment, a plurality of connection pins which electrically connect the contactor 11 and the printed wiring board 13 may be used.

Figure 6:
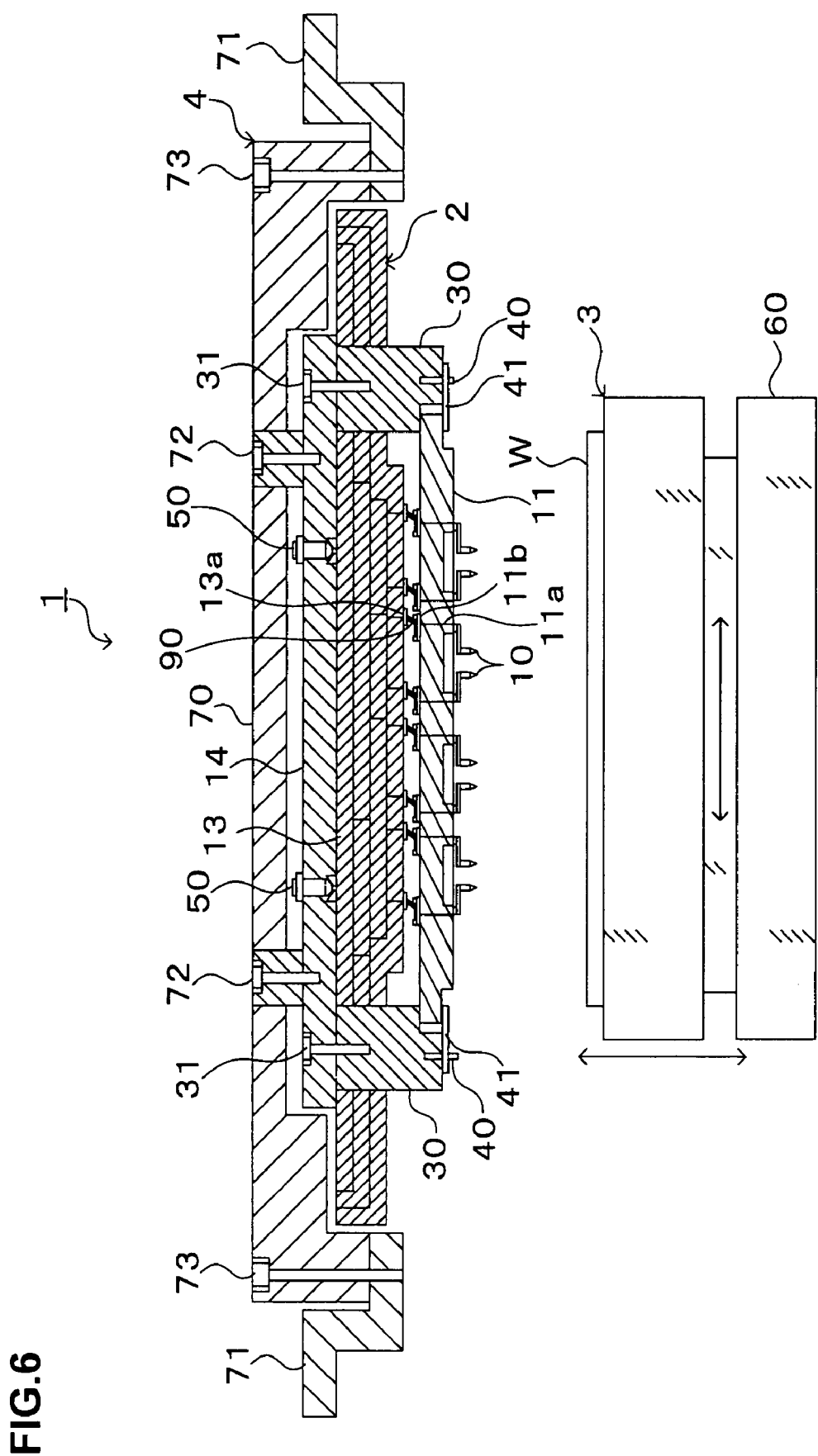
FIG. 6 is a longitudinal sectional view showing the outline of the construction of the prober having a plurality of connection pins.
Figure 7:
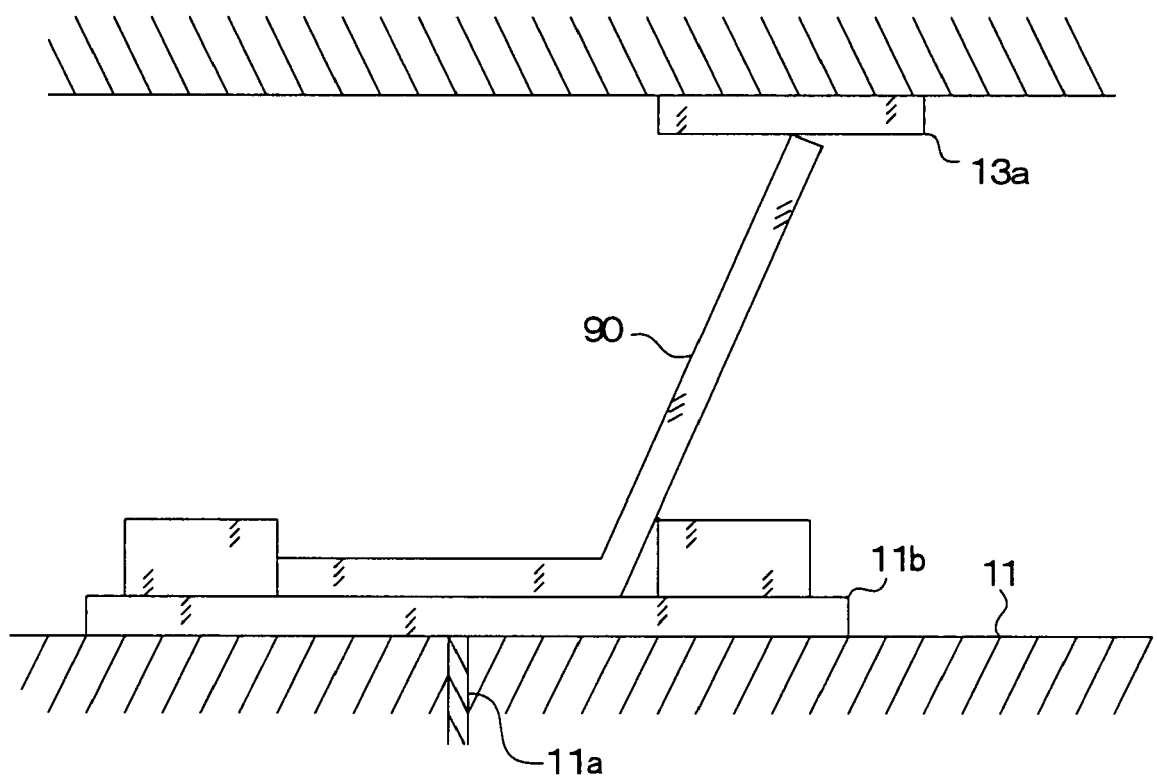
FIG. 7 is a longitudinal sectional view showing the construction of the connection pin.

FIG. 6 shows such an example, a gap of a constant width is provided between the printed wiring board 13 and the top surface of the contactor 11, for example, and in the gap, a plurality of connection pins 90 having elasticity and flexibility are provided. The connection pins 90 are disposed substantially uniformly in the surface of the contactor 11. The connection pin 90 is formed from, for example, nickel having conductivity. The connection pin 90 has its lower end portion joined to a connecting terminal 11b on the top surface of the contactor 11 as shown in, for example, FIG. 7. The connecting terminal 11b is connected to the connecting wire 11a of the contactor 11. In the connection pin 90, an upper side from the joint portion with the connecting terminal 11b is bent toward the side of the printed wiring board 13, and an upper end portion is pressed against a connecting terminal 13a of the printed wiring board 13 and abuts on the connecting terminal 13a. The upper end portion of the connection pin 90 can freely move vertically and laterally while maintaining contact with the printed wiring board 13.

Figure 8:
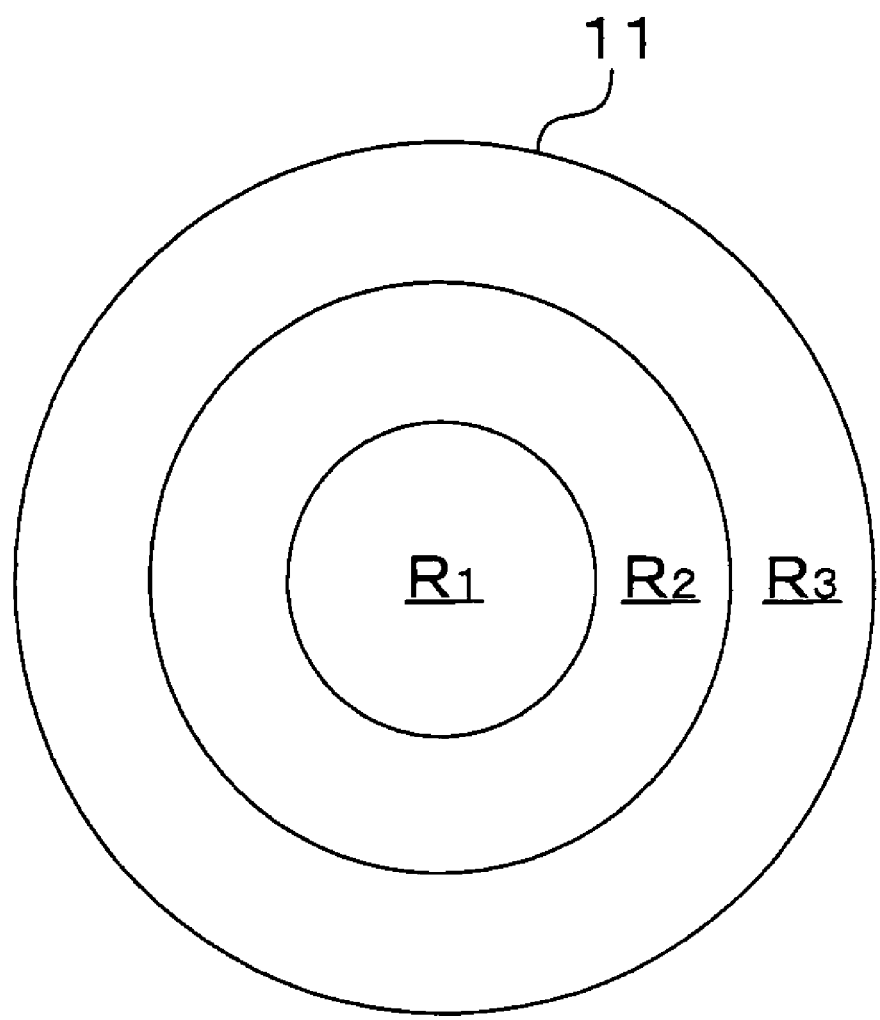
FIG. 8 is a plane view of the contactor for explaining regions of the contactor.

The top surface of the contactor 11 on which the connection pins 90 are disposed is partitioned into a plurality of, for example, three regions R1, R2 and R3 in the shape of concentric circles with the center of the contactor 11 as the center of the circles in the plane view as shown in FIG. 8. The first region R1 is a circular region located in the central part of the contactor 11, and the second region R2 is a ring-shaped region located outside the first region R1. The third region R3 is a ring-shaped region which is located further outside the second region R2 and at the outer peripheral part of the contactor 11.

The connection pins 90 are respectively disposed in the respective regions R1 to R3 of the contactor 11. In the contactor 11, the connection pins 90 which are smaller in elasticity are disposed in the central side from the outer peripheral side. Namely, the connection pins 90 which are smaller in elasticity than those in the third region R3 are disposed in the second region R2, and the connection pins 90 smaller in elasticity than those in the second region R2 are disposed in the first region R1. The connection pins 90 in each of the regions R1 to R3 are set to have predetermined elasticity by changing the material or changing the diameter of the pins, for example.

In such a case, the load which acts on the contactor 11 from all of a plurality of connection pins 90 at the time of contact of the probes 10 and the wafer W is light in the central side and heavy in the outer peripheral side. Therefore, the load which acts on the central side of the contactor 11, which easily bends, decreases, the bending amount in the vicinity of the center of the contactor 11 decreases, and horizontality in the surface of the contactor 11 is maintained. As a result, variation in the heights of a plurality of probes 10 supported on the contactor 11 is suppressed, and contact of each of the probes 10 and the wafer W is performed more stably.

In this example, instead of changing elasticity of the connection pins 90 stepwise for each of the regions R1 to R3, the elasticity of the connection pins 90 may be made gradually and continuously smaller from the outer peripheral side of the contactor 11 toward the central side. In this case, it may be realized by disposing the connection pins 90 with the same elasticity on the same circumference and disposing the connection pins 90 differing in elasticity concentrically.

Preferred embodiments of the present invention are described thus far with reference to the attached drawings, but the present invention is not limited to these examples. Those skilled in the art would obviously conceive various kinds of modification examples or correction examples in the range of the idea described in claims, and it is naturally understood that those examples also belong to the technical range of the present invention. For example, the present invention is applicable to the case where the inspection object is other substrates such as an FPD (flat panel display) except for the wafer W.

INDUSTRIAL AVAILABILITY

The present invention is useful when contact of the inspection object and the probes is stabilized, and reliability of inspection of the electrical characteristics is enhanced.

What is claimed is:

1. A probe card for inspecting electric characteristics of an inspection object, comprising:
    a contactor supporting probes on one surface at a side of the inspection object;
    a circuit board which is opposed to the other surface of said contactor and electrically connected to said contactor; and
    a connector which is interposed between the other surface of said contactor and said circuit board, electrically connects said contactor and said circuit board, and has elasticity,
    wherein said connector is formed so that elasticity of a part near a central side becomes smaller than that of an outer peripheral side of said contactor,
    wherein said connector is formed into a sheet shape which is in contact with the other surface of said contactor, and
    said connector is formed so that the elasticity becomes smaller stepwise in a direction from the outer peripheral side of said contactor toward the central side of said contactor, and
    in said connector, regions differing in elasticity are formed in a shape of concentric circles with a center of said contactor as a center of the circles in a plane view.

2. The probe card according to claim 1,
    wherein said connector is a plurality of connection pins disposed in the other surface of said contactor, and
    the connection pins smaller in elasticity than the connection pins in the outer peripheral side are disposed in the central side of the other surface of said contactor.

* * * * *